(12) United States Patent
Kadomoto et al.

(10) Patent No.: US 8,630,093 B2
(45) Date of Patent: Jan. 14, 2014

(54) SEMICONDUCTOR DEVICE

(75) Inventors: Kei Kadomoto, Shioya-gun (JP); Daiki Kudo, Shioya-gun (JP); Takeshi Nakamura, Shioya-gun (JP); Hiroyuki Nakade, Shioya-gun (JP)

(73) Assignee: Keihin Corporation, Tokyo (JP)

( * ) Notice: Subject to any disclaimer, the term of this patent is extended or adjusted under 35 U.S.C. 154(b) by 256 days.

(21) Appl. No.: 13/041,064

(22) Filed: Mar. 4, 2011

(65) Prior Publication Data

US 2011/0216507 A1 Sep. 8, 2011

(30) Foreign Application Priority Data

Mar. 5, 2010 (JP) ................................. 2010-049506

(51) Int. Cl.
*H05K 7/20* (2006.01)

(52) U.S. Cl.
USPC .......................................................... 361/717

(58) Field of Classification Search
None
See application file for complete search history.

(56) References Cited

U.S. PATENT DOCUMENTS

| | | | | |
|---|---|---|---|---|
| 3,316,454 A | * | 4/1967 | Hans Donath et al. | 361/714 |
| 4,630,174 A | * | 12/1986 | Kaufman | 361/713 |
| 4,819,042 A | * | 4/1989 | Kaufman | 257/676 |
| 4,929,801 A | * | 5/1990 | Hibbert | 174/16.2 |
| 5,068,763 A | * | 11/1991 | Brown et al. | 361/659 |
| 5,466,889 A | * | 11/1995 | Faulkner et al. | 174/68.2 |
| 5,625,536 A | * | 4/1997 | Soyano et al. | 361/736 |
| 5,761,040 A | * | 6/1998 | Iwasa et al. | 361/704 |
| 5,854,445 A | * | 12/1998 | Graham et al. | 174/99 B |
| 6,329,598 B1 | * | 12/2001 | M'Sadoques et al. | 174/68.2 |
| 6,469,907 B1 | * | 10/2002 | Faveluke et al. | 361/760 |
| 6,574,094 B1 | * | 6/2003 | Morrow et al. | 361/676 |
| 6,689,956 B2 | * | 2/2004 | Alexander et al. | 174/72 B |
| 6,995,461 B2 | * | 2/2006 | Soyano et al. | 257/678 |
| 7,242,584 B2 | * | 7/2007 | Kroneder | 361/714 |
| 7,336,491 B2 | * | 2/2008 | Goemmel et al. | 361/707 |
| 7,417,859 B2 | * | 8/2008 | Bae et al. | 361/710 |
| 7,457,120 B2 | * | 11/2008 | Bae et al. | 361/704 |
| 7,504,720 B2 | * | 3/2009 | Nakatsu et al. | 257/712 |
| 7,542,294 B2 | * | 6/2009 | Caines et al. | 361/704 |
| 7,583,505 B2 | * | 9/2009 | Wakabayashi et al. | 361/714 |
| 7,880,283 B2 | * | 2/2011 | Zhuang | 257/678 |
| 7,892,893 B2 | * | 2/2011 | Obara | 438/112 |
| 7,944,042 B2 | * | 5/2011 | Yoshihara et al. | 257/693 |
| 2002/0008964 A1 | * | 1/2002 | Hutchison et al. | 361/724 |
| 2002/0093789 A1 | * | 7/2002 | Sloan et al. | 361/687 |
| 2002/0172009 A1 | * | 11/2002 | Ikushima et al. | 361/714 |

(Continued)

FOREIGN PATENT DOCUMENTS

| | | |
|---|---|---|
| JP | 2009-158631 A | 7/2009 |
| JP | 2009-158632 A | 7/2009 |

*Primary Examiner* — Jinhee Lee
*Assistant Examiner* — Xanthia C Cunningham
(74) *Attorney, Agent, or Firm* — Westerman, Hattori, Daniels & Adrian, LLP (57) ABSTRACT

A semiconductor device is provided with a power module capable of supplying an alternate current to a load, while a direct current is supplied from a battery to the power module for conversion into the alternate current, a cooling member capable of radiating heat generated by the power module, and a mounting member, integrally formed with a spring portion protruding in part therefrom and having elasticity, which allows the power module to be mounted on the cooling member under a state where one surface of the power module is caused to face the cooling member and the spring portion is pressed against the other surface of the power module in opposition to the one surface thereof.

5 Claims, 6 Drawing Sheets

(56) References Cited

U.S. PATENT DOCUMENTS

| | | | |
|---|---|---|---|
| 2003/0183907 A1* | 10/2003 | Hayashi et al. | 257/666 |
| 2005/0135065 A1* | 6/2005 | Nakatsu et al. | 361/703 |
| 2007/0151705 A1* | 7/2007 | Kwan | 165/80.2 |
| 2008/0024996 A1* | 1/2008 | Jacobson et al. | 361/714 |
| 2008/0130223 A1* | 6/2008 | Nakamura et al. | 361/689 |
| 2008/0294324 A1* | 11/2008 | Yoshinari et al. | 701/102 |
| 2009/0073659 A1* | 3/2009 | Peng | 361/709 |

* cited by examiner

SEMICONDUCTOR DEVICE

BACKGROUND OF THE INVENTION

The present invention relates to a semiconductor device and, more particularly, to a semiconductor device having a mounting member with which a functional device, such as a power module, is mounted on a cooling member.

In recent years, a hybrid vehicle provided with a drive-force source composed of an engine, such as an internal combustion engine, and a motor such as an electric motor, have been widely spread in use. Such a hybrid vehicle has a power drive unit through which a direct current, supplied from a battery, is converted to an alternate current for supply to the motor whereas an alternate current, resulting from regenerative operation of the motor, is converted to a direct current for storage in the battery.

The power drive unit is provided with a power module for performing such DC/AC conversion and AC/DC conversion. Such a power drive unit employs a relatively large current and, hence, a power module, incorporating so-called power semiconductor elements, is assembled therein. That is, as the power modules operate, a relatively large amount of heat is generated. To ensure a heat radiation path, therefore, a heat sink is attached to the power module.

Japanese Patent Application Laid-Open Publication No. 2009-158631 discloses a power drive unit having a power module pressed against a heat sink and fixedly secured thereto upon using a pressing member. In such a structure, the spring member, formed in a nearly circular shape, is interleaved between the power module and the pressing member with a view to causing the power module to be fixedly secured onto the heat sink for avoiding limitations in layout and a decrease in heat radiating performance.

Further, Japanese Patent Application Laid-Open Publication No. 2009-158632 discloses a power drive unit having a plurality of power modules pressed against a heat sink and fixedly secured thereto upon using pressing members. In such a structure, a spring member is interleaved between each of the plurality of power modules and the pressing member with a view to causing the power module to be fixedly secured onto the heat sink for avoiding limitations in layout and a decrease in heat radiating performance, while equalizing load applied to the plurality of power modules.

SUMMARY OF THE INVENTION

However, according to several studies conducted by the present inventors of the present invention, the power drive units, disclosed in Japanese Patent Application Laid-Open Publications No. 2009-158631 and No. 2009-158632, are comprised of the spring members that are placed as separate component parts between the power modules and the pressing members. This results in a tendency of causing an increase in the number of component parts with the occurrence of a complicated structure.

With such structures, further, the spring member is sandwiched between the power module and the pressing member, under which a need arises to inevitably perform work of assembling the power modules onto the heat sink while causing the pressing members to be intervened therebetween as kept depressed, resulting in another tendency of causing increased assembling man-hour.

The present invention has been completed with the above view in mind and has an object to provide a semiconductor device that can reduce the number of component parts with a simplification in structure.

To achieve the above object, according to a first aspect of the present invention, there is provided a semiconductor device comprising a power module capable of supplying an alternate current to a load, while a direct current is supplied from a battery to the power module for conversion into the alternate current, a cooling member capable of radiating heat generated by the power module, and a mounting member, integrally formed with a spring portion protruding in part therefrom and having elasticity, which allows the power module to be mounted on the cooling member under a state where one surface of the power module is caused to face the cooling member and the spring portion is pressed against the other surface of the power module in opposition to the one surface thereof.

Due to the first aspect of the present invention, the mounting member is provided in a structure integrally formed with a spring portion protruding in part therefrom and having elasticity, which allows the power module to be mounted on the cooling member under a state where one surface of the power module is caused to face the cooling member and the spring portion is pressed against the other surface of the power module in opposition to the one surface thereof. This makes it possible to provide a semiconductor device composed of the spring portion and the mounting member formed as one component part, while achieving a reduction in the number of component parts with simplification in structure.

In addition to the first aspect, further, the present invention has a second aspect in which the mounting member is made of plate member having elasticity, and a through-hole is provided to be located in a part of a circumferential portion surrounding the spring portion of the mounting member.

Due to the second aspect of the present invention, the through-hole is provided to be located in a part of a circumferential portion surrounding the spring portion of the mounting member. This results in an ease of forming a part of the plate member in protrusion while accurately obtaining elasticity of the spring portion, thereby enabling the spring portion to be simply fabricated.

In addition to the second aspect, furthermore, the present invention has a third aspect in which the through-hole is provided with a pair of through-holes, extending in a longitudinal direction of the mounting member to be placed in opposition to each other such that the spring portion is sandwiched therebetween, and each of the pair of through-holes has a length longer than a length of the spring portion in the longitudinal direction of the mounting member.

Due to the third aspect of the present invention, the through-hole is provided with a pair of through-holes, extending in a longitudinal direction of the mounting member to be placed in opposition to each other such that the spring portion is sandwiched between, and each of the pair of through-holes has a length longer than a length of the spring portion in the longitudinal direction of the mounting member. This allows the spring member to surely have elasticity, thereby enabling the spring portion to be fabricated in a further simplified fashion.

In addition to the third aspect, moreover, the present invention has a fourth aspect in which the mounting member includes a pair of flange portions formed on the mounting member correspondingly at parts of both peripheral edge portions thereof extending along the longitudinal direction of the mounting member, with the both peripheral edge portions being folded to define the pair of flange portions stood upright to face each other.

Due to the fourth aspect of the present invention, the mounting member includes a pair of flange portions formed on the mounting member correspondingly at parts of both peripheral edge portions thereof extending along the longitudinal direction of the mounting member, with the both peripheral edge portions being folded to define the pair of flange portions stood upright to face each other. This enables the plate member per se to have increased mechanical strength, thereby enabling the power module to be mounted on the cooling member with a uniform pressing force.

In addition to the fourth aspect, besides, the present invention has a fifth aspect in which the mounting member is further provided with a fastening aperture to be fastened to the cooling member therethrough and cutout portions formed by removing parts of the pair of flange portions at a peripheral region of the fastening aperture.

Due to the fifth aspect of the present invention, the mounting member is further provided with a fastening aperture to be fastened to the cooling member therethrough and cutout portions formed by removing parts of the pair of flange portions at a peripheral region of the fastening aperture. This enables the mechanical strength of the mounting member to be partially lowered to allow the fastening force of the fastening member to be absorbed in such a region with weakened mechanical strength when the power module is mounted on the cooling member using the fastening member. This provides a capability of preventing undesired fastening force from acting on the power module.

In addition to the fifth aspect, besides, the present invention has a sixth aspect in which the pair of flange portions, which are remnants other than portions where the cutout portions are provided, have lengths longer than lengths of the pair of through-holes in the longitudinal direction of the mounting member.

Due to the sixth aspect of the present invention, the pair of flange portions, which are remnants other than portions where the cutout portions are provided, have lengths longer than lengths of the pair of through-holes in the longitudinal direction of the mounting member. This enables the flange portions to reliably cover the peripheral edge portions of the spring portion at the lateral side thereof. Thus, even if the cutout portions are provided, the elasticity of the spring portion can be maintained under a desired state.

DETAILED DESCRIPTION OF THE PREFERRED EMBODIMENT

Now, a semiconductor device of an embodiment according to the present invention will be described below in detail with reference to the accompanying drawings. Throughout the drawings, an x-axis, a y-axis and a z-axis represent a three-axis orthogonal coordinate system with a direction of the x-axis representing a longitudinal direction, a direction of the y-axis representing a lateral direction and a direction of the z-axis representing a vertical direction.

First, a structure of a control apparatus for a vehicle, to which the semiconductor device of the present embodiment is applied, will be described below in detail with reference to FIG. 1. In addition, the semiconductor device of the present embodiment will be described below with reference to a power drive unit by way of example.

Figure 1:
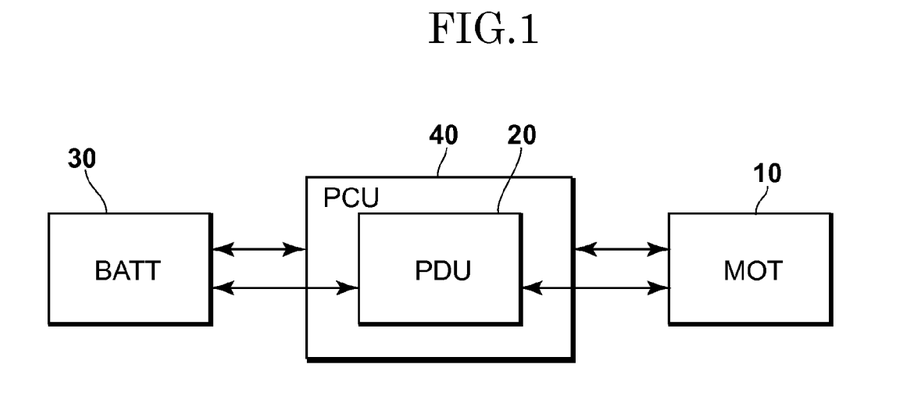
FIG. 1 is a block diagram showing a structure of a control apparatus, with its related devices, for a vehicle to which a semiconductor device of an embodiment according to the present invention is applied

FIG. 1 is a block diagram showing a structure of a control apparatus, with its related devices, for the vehicle to which the semiconductor device of the present embodiment is applied.

In the illustrated embodiment, as shown in FIG. 1, a motor 10 is mounted on the vehicle such as a motor vehicle, which is not shown in the drawings, and connected to a battery 30 via a PDU (Power Drive Unit) 20.

The motor 10 typically is an alternate current synchronous motor such as a DC brushless motor to which electric power is supplied in a three-phase alternate current for operation. In the vehicle driven with a drive-force source composed of only the motor 10, the motor 10 serves to supply a drive force for driving the vehicle. On the contrary, in the vehicle driven with a main drive-force source composed of an engine such as an internal combustion engine that is not shown in the drawings, the motor 10 is used in combination with a drive force of the engine in a supplementary and complementary fashion. In this case, the motor 10 can also have a function to suitably and selectively operate as not only a starter motor when starting up the engine but also an electric power generator with the engine remaining under operation. In any case, moreover, the motor 10 can suitably and selectively function as an energy regenerating mechanism upon utilizing inertial energy during deceleration of the vehicle.

The battery 30 typically is a secondary battery such as a nickel metal-hydride battery and a lithium-ion battery, and supplies the motor 10 and other auxiliary equipment with electric power at required rates. In addition, the battery 30 is able to store regenerative electric power collected through the motor 10 or the like and electric power generated by the motor 10, an electric power generator that is separately provided but not shown in the drawings, or the like.

The PDU 20 is a low-level controller of a PCU (Power Control Unit) 40 that totally controls the motor 10 and the battery 30. The PDU 20 performs in combination both a DC/AC converter function, in which when a three-phase alternate current is employed, a direct current delivered from the battery 30 is stably converted into a three-phase alternate current for supply to the motor 10, and an AC/DC converter, in which an alternate current such as a regenerative alternate current delivered from the motor 10 is stably converted to a direct current for supply to the battery 30. Besides, the PDU 20 may suffice to have only the function of the DC/AC converter arranged to stably convert a direct current, delivered from the battery 30, into a three-phase alternate current for supply to the motor 10 depending on needs.

Under a circumstance where a main drive-force source of the vehicle is comprised of a fuel cell that is not shown in the drawings, the battery 30 is able to supply auxiliary equipment with electric power at required rates while making it possible to store excessive electric power from the fuel cell, regenerative electric power, or the like. Under such a circumstance, further, the PDU 20 acts as the low-level controller of the PCU 40, which totally controls the battery 30 and the fuel cell, to have combined functions of both the DC/AC converter, in which a direct current mainly delivered from the fuel cell is stably converted into a three-phase alternate current for supply to the motor 10, and the AC/DC converter, in which an alternate current such as a regenerative alternate current delivered from the motor 10 is stably converted to a direct current for supply to the battery 30.

Next, a concrete structure of the PDU 20 will be described below in further detail with reference to FIGS. 2 to 5B.

Figure 2:
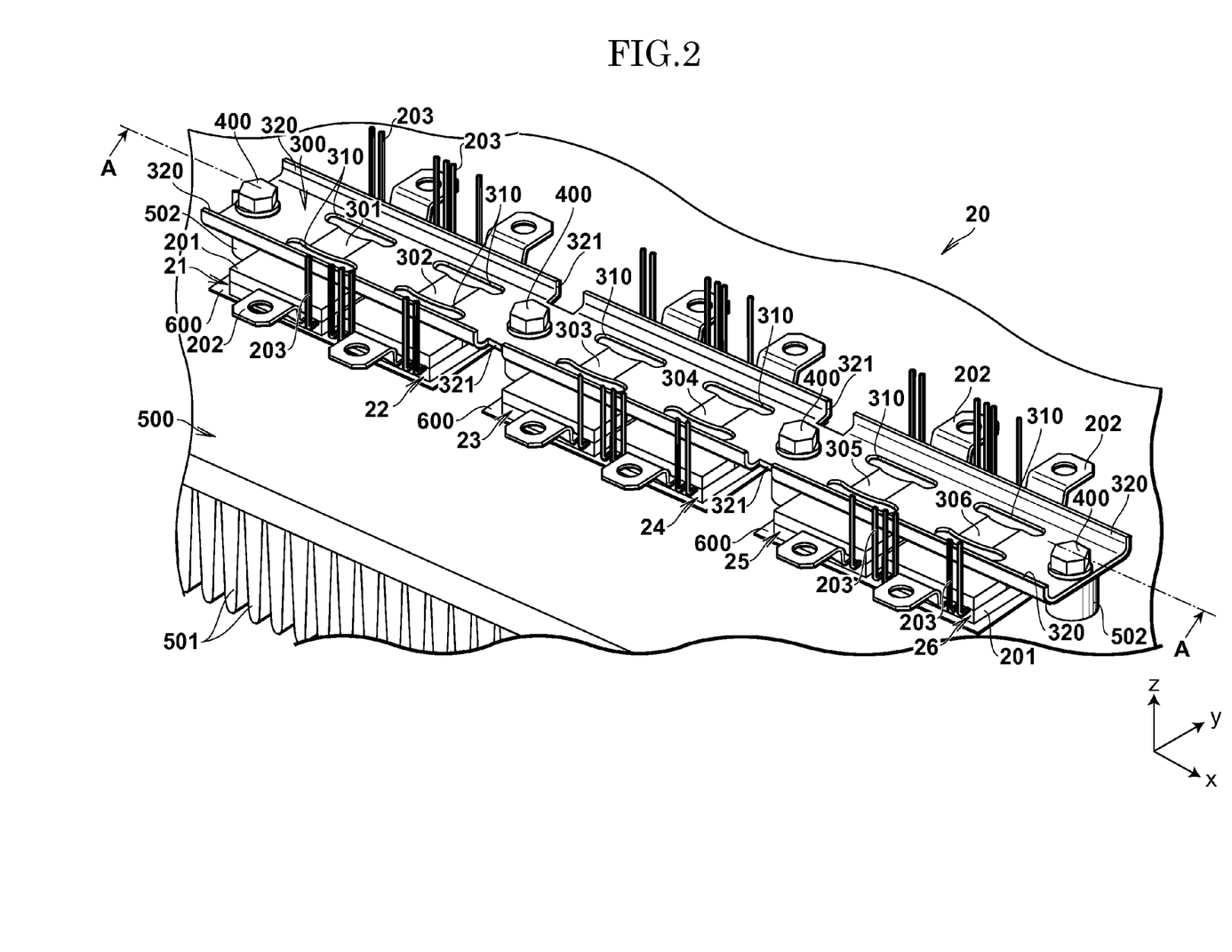
FIG. 2 is a perspective view of a relevant part of the semiconductor device of the present embodiment.
Figure 3:
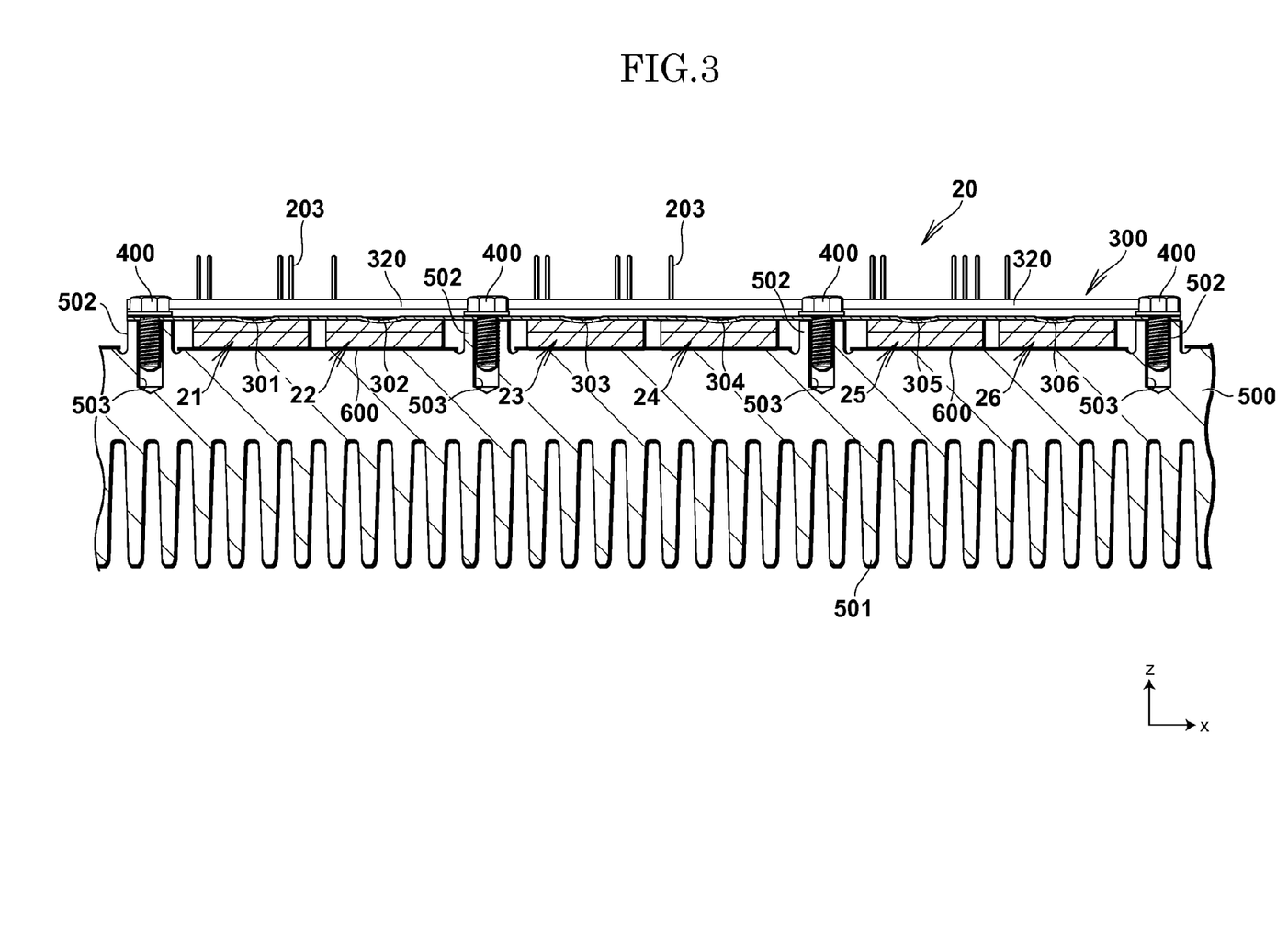
FIG. 3 is a cross-sectional view of the semiconductor device of the present embodiment and corresponds to a cross-sectional view taken on line A-A of FIG. 2.
Figure 4:
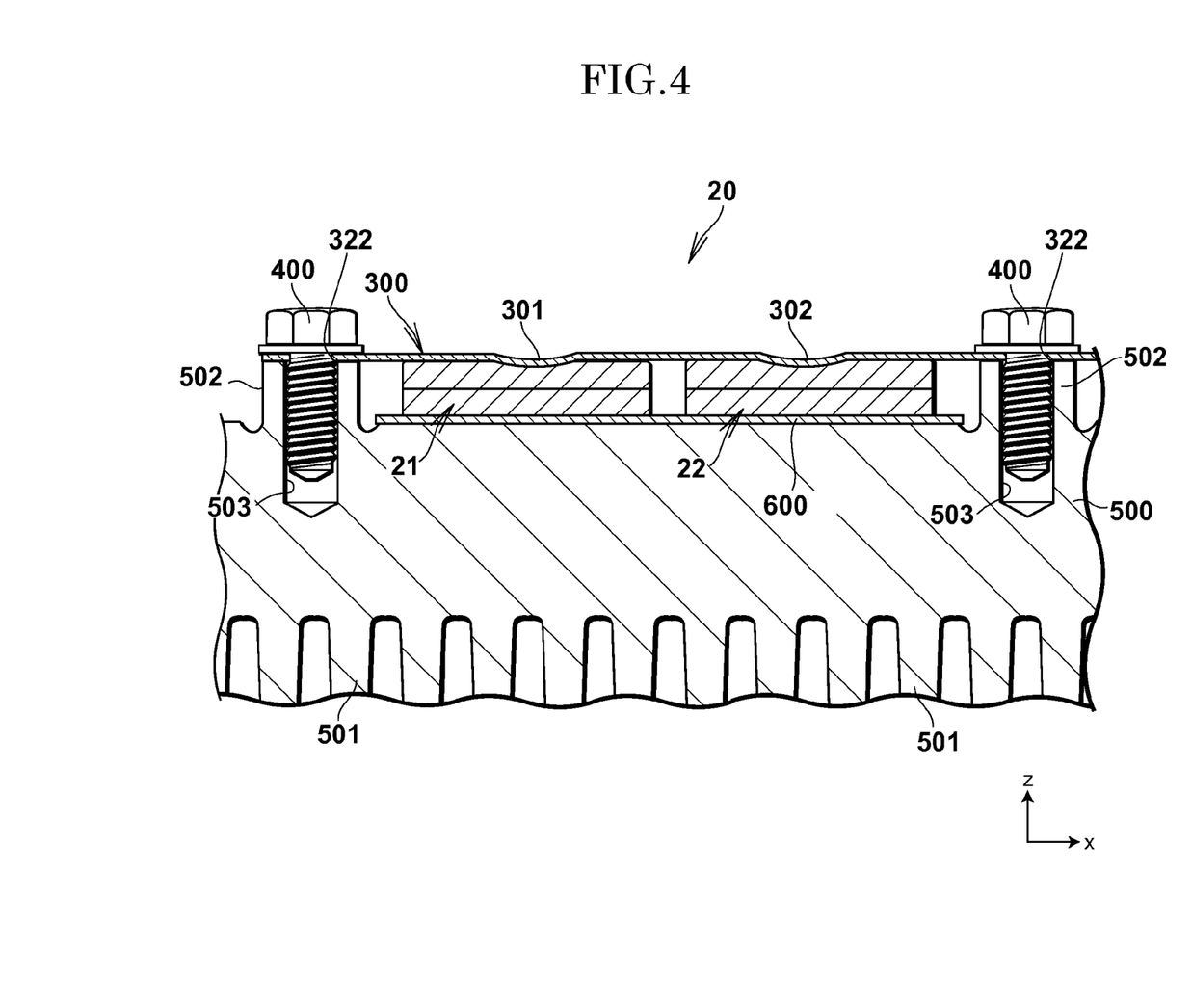
FIG. 4 is an enlarged cross-sectional view of the relevant part of the semiconductor device of the present embodiment.
Figures 5A, 5B:
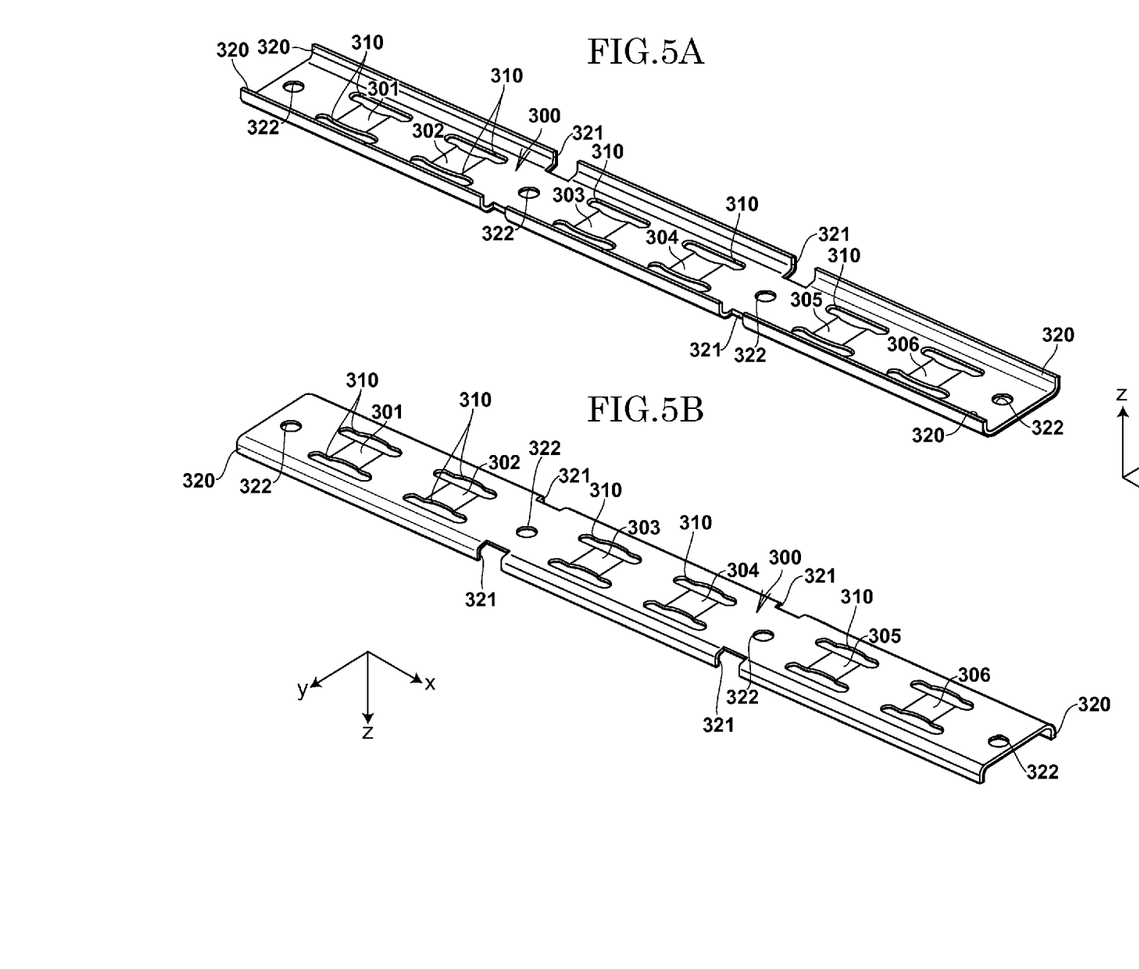
FIG. 5A is a perspective view of a mounting member for the semiconductor device of the present embodiment.
FIG. 5B is a rear perspective view of the mounting member for the semiconductor device of the present embodiment and corresponds to a view when viewing FIG. 5A from a negative direction to a positive direction along a z-axis.

FIG. 2 is a perspective view of a relevant part of the semiconductor device of the present embodiment. FIG. 3 is a cross-sectional view of the semiconductor device of the present embodiment and corresponds to a cross-sectional view taken on line A-A of FIG. 2. FIG. 4 is an enlarged cross-sectional view of the relevant part of the semiconductor device of the present embodiment including a mounting member with flange portions or the like being omitted in the drawing. FIG. 5A is a perspective view of a mounting member for the semiconductor device of the present embodiment. Also, FIG. 5B is a rear perspective view of the mounting member for the semiconductor device of the present embodiment and corresponds to a view when viewing FIG. 5A from a negative direction to a positive direction along a z-axis.

As shown in FIGS. 2 to 5B, the PDU 20, which represents the semiconductor device of the present embodiment, includes power modules 21, 22, 23, 24, 25 and 26 that are mounted on a cooling member 500 and fixed thereto in place using fastening members 400 such as hexagon-head flange bolts, under a state in which the power modules 21 to 26 are pressed to the cooling member 500 by use of a mounting member 300, respectively. Specifically, the power modules 21 to 26 are fixedly secured to the cooling member 500 with adhesive member 600 disposed therebetween, respectively. An example of such an adhesive member 600 is that composed of an electrically insulating and thermally conductive sheet, which has excellent heat conductivity, and grease coated on the insulating and thermally conductive sheet on both upper surface (top surface) and lower surface (rear surface) thereof.

That is, the PDU 20 is provided with the power modules 21 to 26, the cooling member 500 for radiating heat generated by the power modules 21 to 26, and the mounting member 300. Specifically, the mounting member 300 has spring portions 301, 302, 303, 304, 305 and 306 partially protruding to be in correspondence with the power modules 21 to 26 and having respective elasticity, with the spring portions 301 to 306 taking the form of a unitary structure as one component part with the mounting member 300, respectively. Here, the power modules 21 to 26 are mounted on the cooling member 500 under a state in which lower surfaces of the power modules 21 to 26 respectively faces an upper surface of the cooling member 500 and also the spring portions 301 to 306 are respectively pressed against parts of the power modules 21 to 26 at upper surfaces (top surfaces) of the power modules 21 to 26 in opposition to the lower surfaces (rear surfaces) thereof.

When using the three-phase alternate current, the power modules 21 to 26 have combined functions of the DC/AC converter, in which the direct current delivered from the battery 30 is converted into the three-phase alternate current for supply to the motor 10 shown in FIG. 1, and the AC/DC converter, in which the alternate current such as the regenerative alternate current delivered from the motor 10 is converted into the direct current for supply to the battery 30. Specifically, the power modules 21 and 22 correspondingly play roles as a switching power module of a U-phase for high level thereof and a switching power module of the U-phase for low level thereof. In addition, the power modules 23 and 24 correspondingly play roles as a switching power module of a V-phase for high level thereof and a switching power module of the V-phase for low level thereof. Likewise, the power modules 25 and 26 correspondingly play roles as a switching power module of a W-phase for high level thereof and a switching power module of the W-phase for low level thereof.

That is, the PDU 20 includes the power modules 21 to 26 assembled in total of six pieces with two pieces for each phase. Incidentally, the PDU 20 may suffice to include three power modules as a power module by which both the high level of the U-phase and the low level of the U-phase are switched, a power module by which both the high level of the V-phase and the low level of the V-phase are switched, and a power module by which both the high level of the W-phase and the low level of the W-phase are switched.

Specifically, the power modules 21 to 26 are provided with power switching elements that is not shown in the drawings, casings 201 hermetically sealing the power switching elements, die pad leads 202 on which the power switching elements are mounted within the respective casings 201, and plural signal pins 203 connected to electrodes of the power switching elements within the respective casings 201 and extracted to the outside of the respective casings 201. The power switching elements are not limited but may include transistors such as insulated gate bipolar transistors (IGBT). The casings 201 are, for instance, resin sealing bodies and formed through a transfer molding method. The die pad leads 202 and the signal pins 203 may be made of metallic material such as copper and copper alloy with excellent electrical conductivity and heat conductivity. Although reference numerals are omitted, the die pad leads 202 have outer portions provided with mounting holes, respectively.

The cooling member 500 is a heat sink for radiating heat, which is generated by the power modules 21 to 26 in operations thereof, to the outside of the PDU 20. Such a cooling member 500 is located beneath the power modules 21 to 26. In other words, the power modules 21 to 26 are located on the cooling member 500, respectively. The cooling member 500 is integrally formed with a plurality of heat radiating fins 501 for increasing a surface area of the cooling member 500 to provide increased heat radiating efficiency. Also, the cooling member 500 is made of material such as, for instance, aluminum alloy having excellent heat conductivity and durability.

The mounting member 300 has the spring portions 301 to 306 formed to be corresponded to the power modules 21 to 26 in total of six pieces and sequentially arranged in a straight line along a longitudinal direction of the mounting member 300 so as to allow the power modules 21 to 26 to be mounted on the cooling member 500 under a predetermined pressed state at once. Also, the mounting member 300 is made from a base member of a plate member having a lengthy shape.

More particularly, the mounting member 300 has a dimension in short side along a lateral direction of the mounting member 300, which is shorter in width than a width between opposing ones of the signal pins 203 and a width between opposing ones of the die pad leads 202 of the power modules 21 to 26, and a dimension in long side along the longitudinal direction of the mounting member 300, which enables the total of six pieces of power modules 21 to 26 to be mounted at once. The plate member, forming the base member of the mounting member 300, may be made of material having mechanical strength appropriate for the power modules 21 to 26 to be mounted and suited for machining process and having appropriate spring characteristics. Examples of the mounting member 300 may practically include, for instance, spring steel made of stainless steel (SUS-CSP) with excellent corrosion resistant, heat resistant and acid resistant properties. Incidentally, such a plate member is not limited to such a metallic material and the mounting member 300 may be made of other metallic material or resin material having equivalent performance.

Here, the spring portion 301 of the mounting member 300 extends along the longitudinal direction of the mounting member 300 while having a protruding shape protruding in a circular arc shape in cross section toward a part of a surface of the casing 201 of the power module 21, in correspondence with a region where the power module 21 is mounted on the cooling member 500. That is, such a protruding shape of the spring portion 301 typically protrudes toward a central portion of an upper surface of the power module 21 in opposition to a lower surface thereof that is to be pressed against the cooling member 500, thereby providing a function to press the power module 21 against the cooling member 500.

Such a spring portion 301 is formed by, for instance, pressing the plate member forming the base member of the mounting member 300 so as to be integrally formed with the mounting member 300. Incidentally, the spring portion 301 may have a polygonal protruding shape in cross section or another protruding shape formed in a plurality of concavo-convex shapes, except for the circular arc shape in cross section, provided that the protruding shape can surely press the casing 201 of the power module 21. Also, the spring portion 301 is not limited to the structure of a bridge-like configuration formed along the longitudinal direction of the mounting member 300 and may extend in a bridge-like configuration formed along the lateral direction. Moreover, as the spring portion 301, not only one configuration but also plural configurations may be provided.

A pair of through-holes 310, 310 are provided in parts of a circumferential portion surrounding the spring portion 301 and formed in slit-like configurations, in a plan view of the mounting member 300. That is, more particularly, such pair of through-holes 310, 310 are located in the mounting member 300 at respective regions opposed to each other in the lateral direction of the mounting member 300 with the spring portion 301 being set as a central position therebetween. Also, the pair of through-holes 310, 310 extend along the longitudinal direction of the mounting member 300 to be longer in dimension than the spring portion 301.

Such through-holes 310 can be formed by blanking simultaneously when forming the spring portion 301 by pressing the plate member described above. Here, since both sides of the spring portion 301 are removed with the pair of through-holes 310, 310 in further elongated dimensions, a part of the plate member can be protruded in easy to enable the spring portion 301 to be easily formed, while making it possible to allow the spring portion 301 to have spring characteristic set up in a further accurate and simplified fashion. Incidentally, the shapes of the through-holes 310 are not limited to the slit-like configurations in the plan view, and may be formed in circular shapes, elliptical shapes, polygonal shapes, or the like, in the plan view. In addition, the number of the through-holes 310 to be provided is not limited to two pieces and may include one piece, three pieces or more.

Likewise, the mounting member 300 has respective spring portions 302, 303, 304, 305 and 306 have structures and functions to press the power modules 22, 23, 24, 25 and 26 against the cooling member 500, correspondingly. Parts of circumferential portions surrounding the spring portions 302 to 306 are formed with through-holes 310, which have the same structures and functions as the through-hole 310 formed at a part of the circumferential portion surrounding the spring portion 301, respectively. Thus, by forming the spring portions 301 to 306 integrally with the mounting member 300 to allow these component parts to be formed in as one component part, the number of component parts can be reduced with simplification in structure.

A pair of flange portions 320, 320 are formed at parts of peripheral edge portions of the mounting member 300, more particularly, at parts of both peripheral edge portions of the mounting member 300 extending along the longitudinal direction thereof in such a manner that the parts of the both peripheral edge portions are folded to define the pair of flange portions 320, 320 standing upright in opposition to each other. The pair of flange portions 320, 320 are folded to be nearly perpendicular with respect to the surface accompanied with the spring portions 301 to 306 and their corresponding plurality of through-holes 310 of the plate member constituting the mounting member 300. This allows the mounting member 300 as a whole to have a function of increasing mechanical strength while permitting the spring portions 301 to 306 to exhibit spring characteristics at predetermined rates. Such flange portions 320 are formed by, for instance, mechanical bending process.

Further, the mounting member 300 is formed with a plurality of fastening apertures 322 at the residual region of the surface accompanied with the spring portions 301 to 306 and their corresponding plurality of through-holes 310. That is, more particularly, the plurality of fastening apertures 322 are formed at both one end and the other end of the mounting member 300 in the longitudinal direction thereof, a position between the power modules 22 and 23, and a position between the power modules 24 and 25, respectively.

That is, the mounting member 300 allows the power modules 21 to 26 to be mounted on the cooling member 500 by using respective fastening members 400 and thus, the fastening apertures 322 are through-holes through which the fastening members 400 penetrate into the cooling member 500 under a state in which parts of the fastening members 400 are mechanically retained by the fastening apertures 322. The fastening members 400 may typically be hexagonal bolts. Incidentally, the fastening members 400 are not limited to the hexagonal bolts but may be of the type such as screws and clips, which allow the mounting member 300 to be mounted on the cooling member 500 with an appropriate fastening force being applied to the mounting member 300 and the like.

Furthermore, the mounting member 300 has a plurality of pairs of opposing cutouts 321, 321 formed by removing the flange portions 320 in part at peripheral regions of the fastening apertures 322, more particularly, at the peripheral regions between the power modules 22 and 23 and the peripheral regions between the power modules 24 and 25. The cutout portions 321 are not of the type limited in shape but may be cutout portions formed by cutting out the flange portions 320 in rectangular shapes so as to reach a planar surface of the mounting member 300 from which the flange portions 320 stand up.

Here, the flange portions 320 have functions to increase mechanical strength of a whole of the mounting member 300 and in addition, such cutout portions 321 have functions to slightly lower mechanical strength of the mounting member 300 in partial regions thereof around the fastening apertures 322. That is, when an attempt is made to mount the mounting member 300 onto the cooling member 500 by using the fastening members 400, the cutout portions 321 have functions to adjust fastening forces such that the fastening forces, applied to the fastening members 400, are not undesirably exerted onto the power modules 21 to 26 especially via the spring portions 301 to 306.

Moreover, the cutout portions 321 are formed in the peripheral regions of the fastening apertures 322 and, on the other hand, the flange portions 320 that are remnant except for the cutout portions 321 are correspondingly left in lengths greater than those of the spring portions 301 to 306 in the longitudinal direction of the mounting member 300. Thus, this makes it possible to allow the flange portions 320 to entirely cover the corresponding peripheral regions of the spring portions 301 to 306 at the lateral sides of the mounting member 300. Even with the provision of such cutout portions 321, therefore, the spring portions 301 to 306 have spring characteristics maintained under desired properties with no occurrence of an adverse affect. In addition, the cutout portions 321 can be simultaneously formed in utilization of, for instance, blanking process conducted for forming the through-holes 310 before the flange portions 320 are formed.

Next, a method of assembling the PDU 20 will be described below in detail with reference further to FIG. 6.

Figure 6:
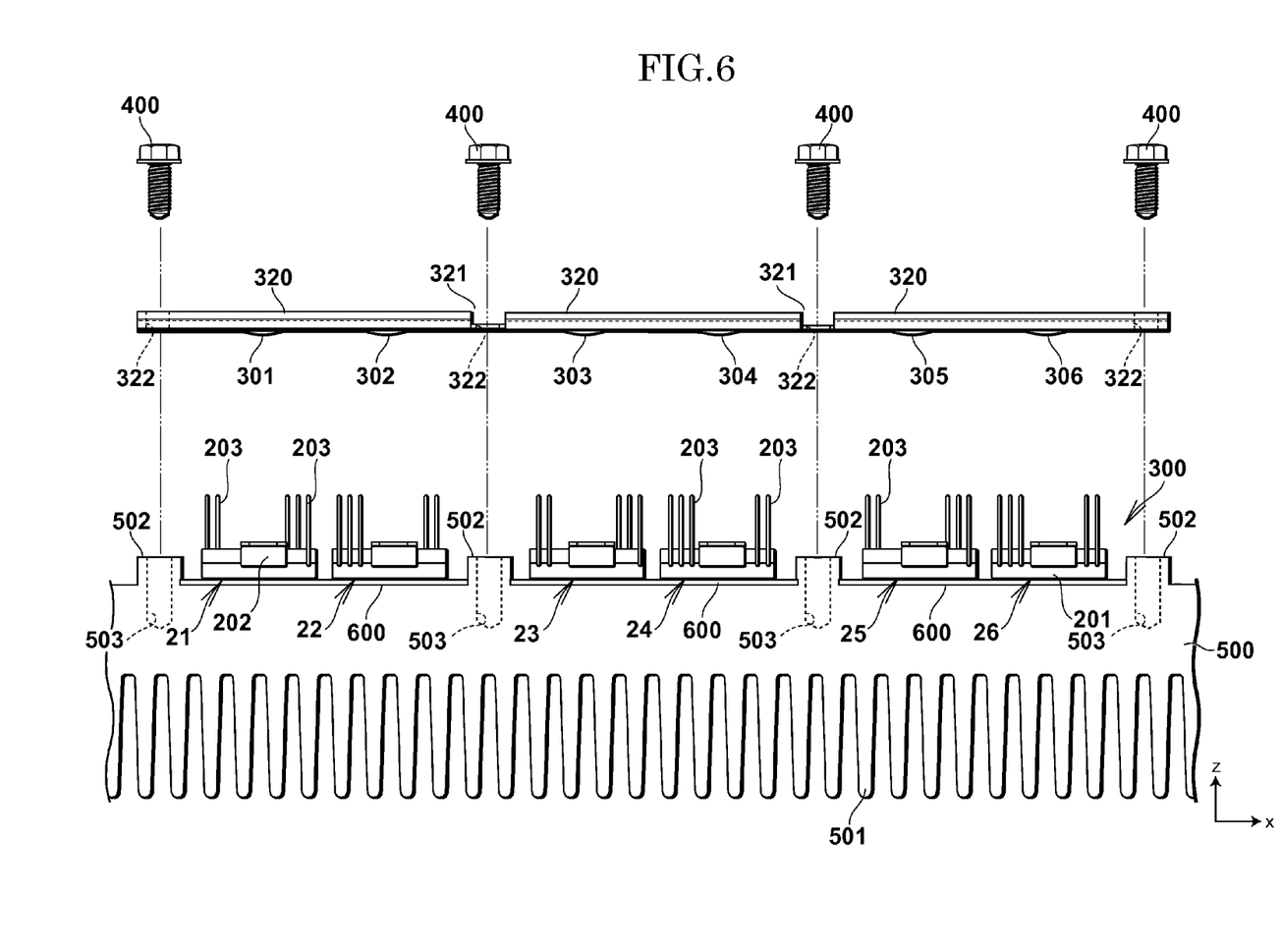
FIG. 6 is a side view showing a state in which the mounting member is to be mounted in the semiconductor device of the present embodiment.

FIG. 6 is a side view showing a state under which the mounting member is to be mounted in the semiconductor device of the present embodiment.

As shown in FIG. 6, first, lower surfaces of the casings 201 of the power modules 21 to 26 are respectively adhered onto an upper surface of the cooling member 500, while intervening the adhesive member 600 therebetween to cause the power modules 21 to 26 to be mounted on the cooling member 500.

Succeedingly, the mounting member 300 is placed to face upper surfaces of the casings 201 of the power modules 21 to 26 and, thereafter, the mounting member 300 is moved downward such that the mounting member 300 is attached onto the upper surfaces of the respective casings 201.

Subsequently, the fastening members 400 are inserted through the fastening apertures 322 of the mounting member 300 placed on the upper surfaces of the respective casings 201 to cause the fastening members 400 to be fastened to the fastening apertures 503 formed in fastening bases 502 of the cooling member 500. When this takes place, the spring portions 301 to 306, integrally formed with the mounting member 300, exhibit respective elastic forces by which the power modules 21 to 26 are pressed uniformly to the cooling member 500 with appropriate pressing loads, under which the power modules 21 to 26 are mounted on the cooling member 500 using the mounting member 30.

Further, since the mounting member 300 is formed with the cutout portions 321, the fastening forces, applied to the fastening member 400, are not undesirably applied to the power modules 21 to 26, thereby resultantly ensuring a path for radiating heat from the power modules 21 to 26 toward the outside via the cooling member 500, with each of the power modules 21 to 26 being in appropriately retained state.

When an attempt is made to allow the PDU 20 with such a structure to operate as a DC/AC converter under control of the PCU 40, a plurality of switching elements including the power modules 21 to 26 are applied with direct current from the battery 30. When this takes place, the switching elements perform predetermined DC/AC conversion in response to control signals being applied through the plurality of signal pins 203 and the outputs, resulting from DC/AC conversion, are supplied from the power modules 21 to 26 to the motor 10. Also, when this takes place, heats, generated by the power modules 21 to 26, are transferred to the cooling member 500 via adhesive member 600, thereby radiating heat from the cooling member 500 to the outside via the heat radiating fins 501.

With such a structure mentioned above, the mounting member 300 is provided in a structure integrally formed with the spring portions 301 to 306 each protruding in part therefrom and having elasticity, which allows the power modules 21 to 26 to be mounted on the cooling member 500 under a state where one surface of each of the power modules 21 to 26 is caused to face the cooling member 500 and each of the spring portions 301 to 306 is correspondingly pressed against the other surface of each of the power modules 21 to 26 in opposition to the one surface thereof. This enables the semiconductor device such as a PDU 20 composed of the spring portions 301 to 306 and the mounting member 300 to be formed as one component part, with both a reduction in the number of component parts and a simplification in structure being achieved.

Further, since the through-holes 310 are located in part of the circumferential portion correspondingly surrounding the spring portions 301 to 306 of the mounting members 300, a part of the plate member forming the mounting member 300 can be easily processed in protrusion while accurately obtaining elasticity of each of the spring portions 301 to 306. This enables the spring portions 301 to 306 to be simply fabricated.

Furthermore, the through-holes 310 include the pair of through-holes 310, 310, extending in the longitudinal direction of the mounting member 300 to be placed in opposition to each other such that corresponding one of the spring portions 301 to 306 is sandwiched therebetween. Each of the pair of through-holes 310, 310 has a length greater than a length of corresponding one of the spring portions 301 to 306 in the longitudinal direction of the mounting member. This results in a capability of fabricating the spring portions 301 to 306 in a further simplified manner while accurately obtaining the elasticity of the spring portions 301 to 306.

Moreover, the mounting member 300 includes a pair of flange portions 320, 320 formed on the mounting member 300 correspondingly at parts of both peripheral edge portions thereof extending along the longitudinal direction of the mounting member 300, with the both peripheral edge portions being folded to define the pair of flange portions 320, 320 stood upright to face each other. This enables the plate member per se forming the mounting member 300 to have increased mechanical strength, while enabling the power modules 21 to 26 to be mounted on the cooling member 500 with a uniform pressing force.

Besides, the mounting member 300 is further provided with the fastening apertures 322 to be fastened to the cooling member 500 therethrough and the cutout portions 321 formed by removing parts of the pair of flange portions 320, 320 at a peripheral region of corresponding one of the fastening apertures 322. This enables the mechanical strength of the mounting member 300 to be lowered in part. When the power modules 21 to 26 are mounted on the cooling member 500 by means of the respective fastening member 400, therefore, the fastening force of each of the fastening members 400 is absorbed in such a region with reduced mechanical strength, while preventing undesired fastening force from being applied to the power modules 21 to 26.

In addition, the pair of flange portions 320, 320, which are remnants other than portions where the cutout portions 321 are provided, have lengths longer than lengths of the corresponding pair of through-holes 310, 310 in the longitudinal direction of the mounting member 300. This enables the pair of flange portions 320, 320 to reliably cover the peripheral edge portions of the corresponding spring portions 301 to 306 at the lateral sides thereof. Thus, even if the cutout portions 321 are provided, the elasticity of each of the spring portions 301 to 306 can be maintained under a desired state.

As described above, according to the present invention, a semiconductor device can be provided with a reduction in the number of component parts and a simplified structure to have general-purpose and universal character based on which it is expected to have wide applications to semiconductor devices such as a power drive unit.

Reference is hereby made to a Patent Application No. TOKUGAN 2010-049506 with a filing date of Mar. 5, 2010 in Japan, the entire content of which is incorporated herein by reference.

The present invention is not limited to the embodiment described above in respect of a kind, placement and the number of the component parts and it is of course to be understood that the relevant component parts may be suitably replaced by those having equivalent advantageous effects and alterations may be suitably made without departing from the scope of the present invention, in light of the teachings. The scope of the invention is defined with reference to the following claims

What is claimed is:

1. A semiconductor device comprising:
   a power module capable of supplying an alternate current to a load, while a direct current is supplied from a battery to the power module for conversion into the alternate current;
   a cooling member capable of radiating heat generated by the power module; and a mounting member, integrally formed with a spring portion protruding in part therefrom to form a protruding portion and having elasticity, which allows the power module to be mounted on the cooling member under a state where one surface of the power module is caused to face the cooling member and the protruding portion spring portion is pressed against the other surface of the power module in opposition to the one surface thereof,
   wherein the mounting member is made of a plate member having elasticity, and a through-hole is provided to be located in a part of a circumferential portion surrounding the spring portion of the mounting member.

2. The semiconductor device according to claim 1, wherein the through-hole is provided with a pair of through-holes, extending in a longitudinal direction of the mounting member to be placed in opposition to each other such that the spring portion is sandwiched therebetween, and each of the pair of through-holes has a length longer than a length of the spring portion in the longitudinal direction of the mounting member.

3. The semiconductor device according to claim 2, wherein the mounting member includes a pair of flange portions formed on the mounting member correspondingly at parts of both peripheral edge portions thereof extending along the longitudinal direction of the mounting member, with the both peripheral edge portions being folded to define the pair of flange portions stood upright to face each other.

4. The semiconductor device according to claim 3, wherein the mounting member is further provided with a fastening aperture to be fastened to the cooling member therethrough and cutout portions formed by removing parts of the pair of flange portions at a peripheral region of the fastening aperture.

5. The semiconductor device according to claim 4, wherein the pair of flange portions, which are remnants other than portions where the cutout portions are provided, have lengths longer than lengths of the pair of through-holes in the longitudinal direction of the mounting member.

* * * * *